(12) United States Patent
Hampp et al.

(10) Patent No.: US 8,154,099 B2
(45) Date of Patent: Apr. 10, 2012

(54) COMPOSITE SEMICONDUCTOR STRUCTURE FORMED USING ATOMIC BONDING AND ADAPTED TO ALTER THE RATE OF THERMAL EXPANSION OF A SUBSTRATE

(75) Inventors: Andreas Hampp, Santa Barbara, CA (US); Tamara H. Wright, Santa Barbara, CA (US); Heather D. Leifeste, Goleta, CA (US)

(73) Assignee: Raytheon Company, Waltham, MA (US)

( * ) Notice: Subject to any disclaimer, the term of this patent is extended or adjusted under 35 U.S.C. 154(b) by 419 days.

(21) Appl. No.: 12/544,075

(22) Filed: Aug. 19, 2009

(65) Prior Publication Data

US 2011/0042772 A1 Feb. 24, 2011

(51) Int. Cl.
*H01L 31/08* (2006.01)
*H01L 21/50* (2006.01)

(52) U.S. Cl. .............. 257/443; 438/67; 257/E21.499; 257/E31.052

(58) Field of Classification Search ............ 438/67; 257/443, E21.499, E31.052
See application file for complete search history.

(56) References Cited

U.S. PATENT DOCUMENTS

| | | | |
|---|---|---|---|
| 4,783,594 A | 11/1988 | Schulte et al. | |
| 5,264,699 A | 11/1993 | Barton et al. | |
| 5,308,980 A | 5/1994 | Barton | |
| 5,365,088 A | 11/1994 | Myrosznyk | |
| 5,393,993 A * | 2/1995 | Edmond et al. | ........... 257/77 |
| 5,672,545 A | 9/1997 | Trautt et al. | |
| 5,827,342 A * | 10/1998 | Jean Beguin et al. | ...... 65/60.5 |
| 5,834,778 A | 11/1998 | Veyrier et al. | |
| 6,236,981 B1 | 5/2001 | Hill | |
| 6,675,600 B1 | 1/2004 | Robillard et al. | |
| 2008/0113495 A1 | 5/2008 | Ginn et al. | |
| 2008/0217717 A1 | 9/2008 | Pfister et al. | |

FOREIGN PATENT DOCUMENTS

| | | |
|---|---|---|
| JP | 1061056 | 3/1989 |
| JP | 6163865 | 6/1994 |
| JP | 6236981 | 8/1994 |
| JP | 7111323 | 4/1995 |
| WO | WO 94/17557 | 8/1994 |
| WO | WO 2008/063397 | 5/2008 |

OTHER PUBLICATIONS

Haas, A.K., et al., 2048×2048 Visible/Infrared HgCdTe Focal Plane Arrays (FPAs), White Paper, 16 pages, Aug. 1999.

* cited by examiner

*Primary Examiner* — David S Blum
(74) *Attorney, Agent, or Firm* — Lando & Anastasi, LLP

(57) ABSTRACT

In certain embodiments, a method includes forming a composite semiconductor structure for altering a rate of thermal expansion of a first substrate. The composite semiconductor structure is formed by atomically bonding a first surface of a thermal matching substrate to a first surface of the first substrate, and atomically bonding a second surface of the thermal matching substrate to a first surface of a balancing substrate. The thermal matching substrate is adapted to alter the rate of thermal expansion of the first substrate and the balancing substrate is adapted to substantially prevent warping of the composite semiconductor structure.

20 Claims, 2 Drawing Sheets

COMPOSITE SEMICONDUCTOR STRUCTURE FORMED USING ATOMIC BONDING AND ADAPTED TO ALTER THE RATE OF THERMAL EXPANSION OF A SUBSTRATE

TECHNICAL FIELD

This invention relates generally to semiconductors and more particularly to a composite semiconductor structure formed using atomic bonding and adapted to alter the rate of thermal expansion of a substrate.

BACKGROUND

As a material is exposed to changes in temperature, the energy stored in the intermolecular bonds between atoms making up the material may change. The change in the energy stored in intermolecular bonds of a material may result in a corresponding dimensional change in the material. For example, solid materials typically expand in response to increases in temperature and contract in response to decreases in temperature. The dimensional response of a material to changes in temperature (i.e., the rate of thermal expansion of the material) may be expressed as a thermodynamic property of the material known as the coefficient of thermal expansion (CTE). The CTE is the fractional change in length of the material per degree of temperature change. Materials having higher CTEs typically experience a greater dimensional change in response to changes in temperature.

SUMMARY

According to the present invention, disadvantages and problems associated with previous solutions for altering the rate of thermal expansion of a substrate may be reduced or eliminated.

In certain embodiments, a method includes forming a composite semiconductor structure for altering a rate of thermal expansion of a first substrate. The composite semiconductor structure is formed by atomically bonding a first surface of a thermal matching substrate to a first surface of the first substrate and atomically bonding a second surface of the thermal matching substrate to a first surface of a balancing substrate. The thermal matching substrate is adapted to alter the rate of thermal expansion of the first substrate and the balancing substrate is adapted to substantially prevent warping of the composite semiconductor structure.

Particular embodiments of the present invention may provide one or more technical advantages. In certain applications, it may be desirable to alter the rate of thermal expansion of a first substrate such that the rate of thermal expansion of the first substrate is substantially equal to the rate of thermal expansion of a second substrate to which the first substrate is to be coupled (such that the first and second substrates expand and contract at substantially the same rate in response to changes in temperature). As a particular example, the first substrate may include a readout integrated circuit (ROIC) device and the second substrate may include a detector array, and it may be desirable to hybridize the ROIC device to the detector array at an elevated temperature to form a sensor chip array (SCA) for image capture. However, because the ROIC device and the detector array may have different CTEs (i.e., different rates of thermal expansion), it may not be possible to hybridize the ROIC device to the detector array at an elevated temperature as misalignment between corresponding interconnects of the ROIC device may result as the ROIC device and the detector array are raised to the elevated temperature.

Furthermore, even if the ROIC device is successfully hybridized to the detector array (e.g., using a hybridization technique other than elevated temperature hybridization), a difference in the rate of thermal expansion between the ROIC device and the detector array may cause electrical contact between corresponding interconnects of the ROIC device and the detector array to deteriorate or be lost as the SCA is subjected to changes in temperature, which may result in poor image quality.

As a result of these problems, it may be desirable to alter the rate of thermal expansion of the ROIC device to be substantially equal to the rate of thermal expansion of the detector array prior to hybridization of the ROIC device to the detector array.

Certain conventional techniques for altering the rate of thermal expansion of a first substrate involve bonding a thermal matching substrate to the first substrate using an epoxy, the thermal matching substrate causing the first substrate to expand and contract at a desired rate in response to temperature changes (e.g., at a rate corresponding to the rate at which a second substrate expands and contracts in response to temperature changes). However, because the epoxy bond between the first substrate and the thermal matching substrate may lose integrity at elevated temperatures (e.g., the temperature at which first substrate may be hybridized to the second substrate), it may not be possible to thermally match the first substrate to the second substrate prior to the elevated temperature hybridization process. As a result of the thermal mismatch between the first substrate and the second substrate, certain conventional techniques may not allow the formation of devices (e.g., SCAs for image capture) having a first substrate (e.g., a ROIC device) hybridized at elevated temperature to a second substrate (e.g., a detector array).

Because the technique for altering the rate of thermal expansion of a first substrate of certain embodiments of the present invention includes forming a composite semiconductor structure using atomic bonds (which are relatively insensitive to temperature changes), the composite semiconductor structure of certain embodiments of the present invention may be formed prior to elevated temperature hybridization. Thus, the first substrate may be thermally matched to a second substrate prior to elevated temperature hybridization and may remain thermally matched to the second substrate during elevated temperature hybridization. As a result, the technique for altering the rate of thermal expansion of a first substrate of certain embodiments of the present invention may allow for the formation of devices (e.g., SCAs for image capture) having a first substrate (e.g., a ROIC device) hybridized at elevated temperature to the second substrate (e.g., a detector array), unlike certain conventional techniques.

Furthermore, even if thermal mismatch between the first and second substrate does not prevent hybridization of the first substrate to the second substrate (as discussed above), it may still be desirable to alter the rate of thermal expansion of the first substrate such that the rate of thermal expansion of the first substrate substantially matches the rate of thermal expansion of the second substrate (for the reasons discussed above). However, because certain conventional techniques do not allow for the altering of the rate of thermal expansion of the first substrate prior to elevated temperature hybridization, it may be necessary to alter the rate of thermal expansion of the first substrate subsequent to hybridization (e.g., by bonding the thermal matching substrate to the first substrate using an epoxy). Because altering the rate of thermal expansion of the first substrate subsequent to hybridization is performed at the die level, which may be time consuming and labor intensive, the cost associated with generating certain devices (e.g., sensor chip arrays (SCAs) for image capture) having a first substrate (e.g., including a ROIC device) hybridized to a second substrate (e.g., including a detector array) may increase.

Because the technique for altering the rate of thermal expansion of a first substrate of certain embodiments of the present invention includes forming a composite semiconductor structure using atomic bonds (which are relatively insensitive to temperature changes), the composite semiconductor structure of certain embodiments of the present invention may be formed prior to elevated temperature hybridization. Thus, the composite semiconductor structure of the present invention may be formed at the wafer level (e.g., by atomically bonding a wafer comprising a plurality of ROIC devices to a thermal matching substrate) as opposed to at the die level. In other words, in certain embodiments, the present invention provides for wafer level thermal expansion matching using atomic bonding. The formed composite semiconductor structure may be diced into a plurality of dies (e.g., each including a single ROIC device), and each die may be hybridized at elevated temperature to a second substrate (e.g., a detector array) to form a device (e.g., a SCA). Forming the composite semiconductor structure of the present invention at the wafer level prior to hybridization may be less time consuming and/or less labor intensive than bonding the thermal matching substrate to the first substrate at the die level subsequent to hybridization. Therefore, the technique for altering the rate of thermal expansion of a first substrate of certain embodiments of the present invention may decrease the cost associated with forming devices (e.g., SCAs for image capture) having a first substrate (e.g., including a ROIC device) hybridized to a second substrate (e.g., including a detector array).

Certain embodiments of the present invention may provide some, all, or none of the above advantages. Certain embodiments may provide one or more other technical advantages, one or more of which may be readily apparent to those skilled in the art from the figures, descriptions, and claims included herein.

BRIEF DESCRIPTION OF THE DRAWINGS

To provide a more complete understanding of the present invention and the features and advantages thereof, reference is made to the following description taken in conjunction with the accompanying drawings, in which.

DESCRIPTION OF EXAMPLE EMBODIMENTS

Figure 1A:
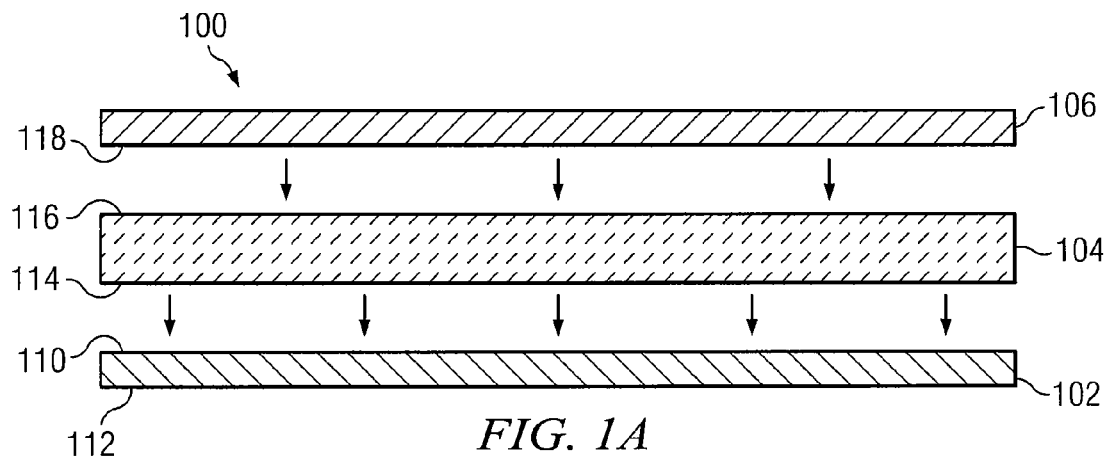
FIGS. 1A-1B illustrate cross-sectional views of an example composite semiconductor structure formed using atomic bonding and adapted to alter the rate of thermal expansion of a first substrate, according to certain embodiments of the present invention.
Figure 1B:
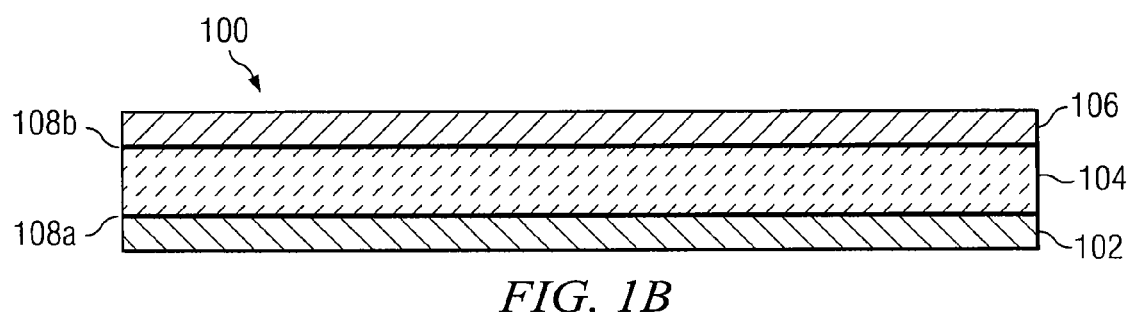

FIGS. 1A-1B illustrate cross-sectional views of an example composite semiconductor structure 100 formed using atomic bonding and adapted to alter the rate of thermal expansion of a first substrate 102, according to certain embodiments of the present invention. Composite semiconductor structure 100 may include, in addition to first substrate 102, a thermal matching substrate 104 and a balancing substrate 106. In certain embodiments, composite semiconductor structure 100 is formed by atomically bonding a first surface 110 of first substrate 102 to a first surface 114 of thermal matching substrate 104 (to generate atomic bond 108a) and atomically bonding a second surface 116 of thermal matching substrate 104 to a first surface 118 of balancing substrate 106 (to generate atomic bond 108b).

In general, composite semiconductor structure 100 may be adapted to alter the rate of thermal expansion of first substrate 102. More particularly, thermal matching substrate 104 (having a thermal matching substrate CTE) and balancing substrate 106 (having a balancing substrate CTE) may be selected such that, when atomically bonded with first substrate 102 (having an associated first CTE), a composite semiconductor structure 100 is formed having a desired rate of thermal expansion that is different than the rate of thermal expansion of first substrate 102.

For example, thermal matching substrate 104 and balancing substrate 106 may be materials that, when atomically bonded with first substrate 102, form a composite semiconductor structure 100 that has a rate of thermal expansion that is substantially equal to the rate of thermal expansion of a substrate to which first substrate 102 is to be hybridized (e.g., second substrate 202, illustrated in FIG. 2). In other words, composite semiconductor structure 100 may be formed to thermally match first substrate 102 with a substrate to which first substrate 102 is to be hybridized by causing first substrate 102 to expand and contract at a rate substantially equal to the rate at which the substrate to which first substrate 102 is to be hybridized expands and contracts in response to changes in temperature. The roles that thermal matching substrate 104 and balancing substrate 106 may play in this "matching" capability are described in greater detail below.

The present invention contemplates that the rate of thermal expansion of composite semiconductor structure 100 is "substantially equal to" the rate of thermal expansion of a substrate to which first substrate 102 is to be hybridized (e.g., second substrate 202, illustrated in FIG. 2) if the rate of thermal expansion of composite semiconductor structure 100 falls within any suitable tolerance with respect to the rate of thermal expansion of second substrate 202. Factors that may be considered in determining a suitable tolerance may include the size of first substrate 102 and second substrate 202, the number of corresponding interconnects connecting first substrate 102 and second substrate 202 once hybridized to form a device 202 (described in further detail below with regard to FIG. 2), the spacing of corresponding interconnects connecting first substrate 102 and second substrate 202 once hybridized to form a device 202, the platform in which the formed device 202 (e.g., a SCA) is to be employed (e.g., the range of operating temperatures of the platform in which the formed device 202 is to be employed), or any other suitable factors, according to particular needs.

First substrate 102 may be any substrate for which it is desirable to alter the rate of thermal expansion. In certain embodiments, first substrate 102 is a wafer formed from any suitable material (e.g., silicon or germanium) and having any suitable size (e.g., four inches, eight inches, or twelve inches). Additionally, the wafer may comprise any suitable number of integrated circuit devices, microelectromechanical system (MEMS) devices, nanoelectromechanical system (NEMS) devices, or any other suitable devices, according to particular needs.

As a particular example, first substrate 102 may be a silicon wafer comprising a plurality of ROIC devices. Furthermore, it may be desirable to alter the rate of thermal expansion of the silicon wafer such that the ROIC devices have a rate of thermal expansion that matches the rate of thermal expansion of substrates (e.g., detector arrays) to which the ROIC devices are to be hybridized (as described in further detail below with regard to FIG. 2).

Thermal matching substrate 104 may be any substrate that, when atomically bonded to first substrate 102, is adapted to alter the rate of thermal expansion of first substrate 102 in a desirable manner. In other words, thermal matching substrate 104 may comprise any material suitable for atomically bonding to first substrate 102 and having a CTE that is different than the CTE of first substrate 102. In certain embodiments, when atomically bonded to first substrate 102 and balancing substrate 106 (described below), thermal matching substrate 104 is a substrate that forms a composite semiconductor structure 100 having a desired rate of thermal expansion. For example, a thermal matching substrate 104 may be selected such that, when atomically bonded to first substrate 102 and balancing substrate 106, the resulting composite semiconductor structure 100 has a rate of thermal expansion that is substantially equal to the rate of thermal expansion of a substrate to which first substrate 102 is to be hybridized (e.g., second substrate 202, described below with regard to FIG. 2).

In certain embodiments, thermal matching substrate 104 is a material having a CTE greater than the CTE of first substrate 102. As a result, when atomically bonded to first substrate 102 and balancing substrate 106, thermal matching substrate 104 causes first substrate 102 to expand and contract at a greater rate in response to temperature changes. For example, first substrate 102 may be a silicon wafer comprising a plurality of ROIC devices, and thermal matching substrate 104 may be an aluminum-silicon alloy, titanium, alumina, sapphire, stainless steel, or any other suitable material having a CTE greater than the CTE of the silicon wafer, according to particular needs.

In certain other embodiments, thermal matching substrate 104 is a material having a CTE less than the CTE of first substrate 102. As a result, when atomically bonded to first substrate 102 and balancing substrate 106, thermal matching substrate 104 causes first substrate 102 to expand and contract at a lesser rate in response to temperature changes.

Balancing substrate 106 may be any substrate that, when atomically bonded to thermal matching substrate 104, reduces or eliminates warping of composite semiconductor structure 100. Because thermal matching substrate 104 may cause first substrate 102 to expand and contract at a different rate in response to temperature changes, a composite structure comprising only first substrate 102 and thermal matching substrate 104 may warp in the direction of the substrate having a lower CTE (i.e., the material that expands and contracts at a slower rate) in response to changes in temperature.

In certain embodiments, balancing substrate 106 is a substrate that provides substantially the same resistance to expansion/contraction as first substrate 102 such that, when first substrate 102 and balancing substrate 106 are atomically bonded on opposing sides of thermal matching substrate 104, composite semiconductor structure 100 is substantially prevented from warping in response to changes in temperature (i.e., composite semiconductor structure 100 is "balanced"). For example, in embodiments in which first substrate 102 of composite semiconductor structure 100 is a silicon wafer comprising a plurality of ROIC devices, balancing substrate 106 may comprise a silicon substrate having a CTE that is substantially the same as the CTE of the silicon wafer comprising the plurality of ROIC devices.

The present invention contemplates that balancing substrate 106 may not prevent all warping of composite semiconductor structure 100 (i.e., composite semiconductor structure 100 may not be perfectly "balanced"), but rather may prevent warping outside any suitable warping tolerance, according to particular needs.

Additional factors that may be considered in forming a composite semiconductor structure 100 having a desired rate of thermal expansion (e.g., a rate of thermal expansion that is substantially equal to the rate of thermal expansion of a substrate to which first substrate 102 is to be hybridized) include the thickness of first substrate 102, the thickness of thermal matching substrate 104, and the thickness of balancing substrate 106.

For example, if the desired rate of thermal expansion is greater than the rate of thermal expansion achieved by forming a composite semiconductor structure 100 by atomically bonding a particular thermal matching substrate 104 with a particular first substrate 102 and a particular balancing substrate 104 (the particular matching substrate 104 having a CTE greater than the CTE of the particular first substrate 102 and the CTE of the particular balancing substrate 106), the rate of thermal expansion of the composite semiconductor structure 100 may be increased by increasing the thickness of the particular thermal matching substrate 104 and/or decreasing the thicknesses of the particular first substrate 102 and the particular balancing substrate 106.

Similarly, if the desired rate of thermal expansion is less than the rate of thermal expansion achieved by forming a composite semiconductor structure 100 by atomically bonding a particular thermal matching substrate 104 with a particular first substrate 102 and a particular balancing substrate 104 (the particular matching substrate 104 having a CTE greater than the CTE of the particular first substrate 102 and the CTE of the particular balancing substrate 106), the rate of thermal expansion of the composite semiconductor structure 100 may be decreased by decreasing the thickness of the particular thermal matching substrate 104 and/or increasing the thicknesses of the particular first substrate 102 and the particular balancing substrate 106.

In other words, the rate of thermal expansion of composite semiconductor structure 100 may be varied without changing the materials of first substrate 102, matching substrate 104, and balancing substrate 106 by varying the thickness of one or more of first substrate 102, matching substrate 104, and balancing substrate 106. As a result, the rate of thermal expansion of first substrate 102 may be more precisely matched to a rate of thermal expansion of a substrate to which first substrate 102 is to be hybridized (e.g., second substrate 202, described below with regard to FIG. 2).

Particular embodiments of the present invention may provide one or more technical advantages. Certain conventional techniques for altering the rate of thermal expansion of a first substrate involve bonding a thermal matching substrate to the first substrate using an epoxy, the thermal matching substrate causing the first substrate to expand and contract at a desired rate in response to temperature changes (e.g., at a rate corresponding to the rate at which a second substrate expands and contracts in response to temperature changes). However, because the epoxy bond between the first substrate and the thermal matching substrate may lose integrity at elevated temperatures (e.g., the temperature at which first substrate may be hybridized to the second substrate), it may not be possible to thermally match the first substrate to the second substrate prior to the elevated temperature hybridization process. As a result of the thermal mismatch between the first substrate and the second substrate, certain conventional techniques may not allow the formation of certain devices (e.g., SCAs for image capture) having a first substrate (e.g., a ROIC device) hybridized at elevated temperature to a second substrate (e.g., a detector array).

Because the technique for altering the rate of thermal expansion of a first substrate 102 of the present invention includes forming a composite semiconductor structure 100 using atomic bonds 108 (which are relatively insensitive to temperature changes), composite semiconductor structure 100 may be formed prior to elevated temperature hybridization. Thus, first substrate 102 may be thermally matched to second substrate 202 (described below) prior to elevated temperature hybridization and may remain thermally matched to the second substrate 202 during elevated temperature hybridization. As a result, the technique for altering the rate of thermal expansion of first substrate 102 (i.e., forming composite semiconductor structure 100) of certain embodiments of the present invention may allow for the formation of certain devices 200 (e.g., SCAs for image capture) having a first substrate 102 (e.g., a ROIC device) hybridized at elevated temperature to a second substrate 202 (e.g., a detector array), unlike certain conventional techniques.

Furthermore, even if thermal mismatch between the first and second substrate does not prevent hybridization of the first substrate to the second substrate (as discussed above), it may still be desirable to alter the rate of thermal expansion of the first substrate such that the rate of thermal expansion of the first substrate substantially matches the rate of thermal expansion of the second substrate (for the reasons discussed above). However, because certain conventional techniques do not allow for the altering of the rate of thermal expansion of the first substrate prior to elevated temperature hybridization, it may be necessary to alter the rate of thermal expansion of the first substrate subsequent to hybridization (e.g., by bonding the thermal matching substrate to the first substrate using an epoxy). Because altering the rate of thermal expansion of the first substrate subsequent to hybridization is performed at the die level, which may be time consuming and labor intensive, the cost associated with generating certain devices (e.g., sensor chip arrays (SCAs) for image capture) having a first substrate (e.g., including a ROIC device) hybridized to a second substrate (e.g., including a detector array) may increase.

Because the technique for altering the rate of thermal expansion of a first substrate 102 of the present invention includes forming a composite semiconductor structure 100 using atomic bonds 108 (which are relatively insensitive to temperature changes), composite semiconductor structure 100 may be formed prior to elevated temperature hybridization. Thus, composite semiconductor structure 100 may be formed at the wafer level (e.g., by atomically bonding a wafer comprising a plurality of ROIC devices to a thermal matching substrate) as opposed to at the die level. In other words, in certain embodiments, the present invention provides for wafer level thermal expansion matching using atomic bonding. The formed composite semiconductor structure 100 may be diced into a plurality of dies (e.g., each including a single ROIC device), and each die may be hybridized at elevated temperature to a second substrate 202 (e.g., a detector array) to form a device (e.g., a SCA). Forming composite semiconductor structure 100 at the wafer level prior to hybridization may be less time consuming and/or less labor intensive than bonding thermal matching substrate 104 to first substrate 102 at the die level subsequent to hybridization. Therefore, the technique for altering the rate of thermal expansion of first substrate 102 of certain embodiments of the present invention may decrease the cost associated with forming devices 200 (e.g., SCAs for image capture) having a first substrate 102 (e.g., including a ROIC device) hybridized to a second substrate 202 (e.g., including a detector array).

Figure 2A:
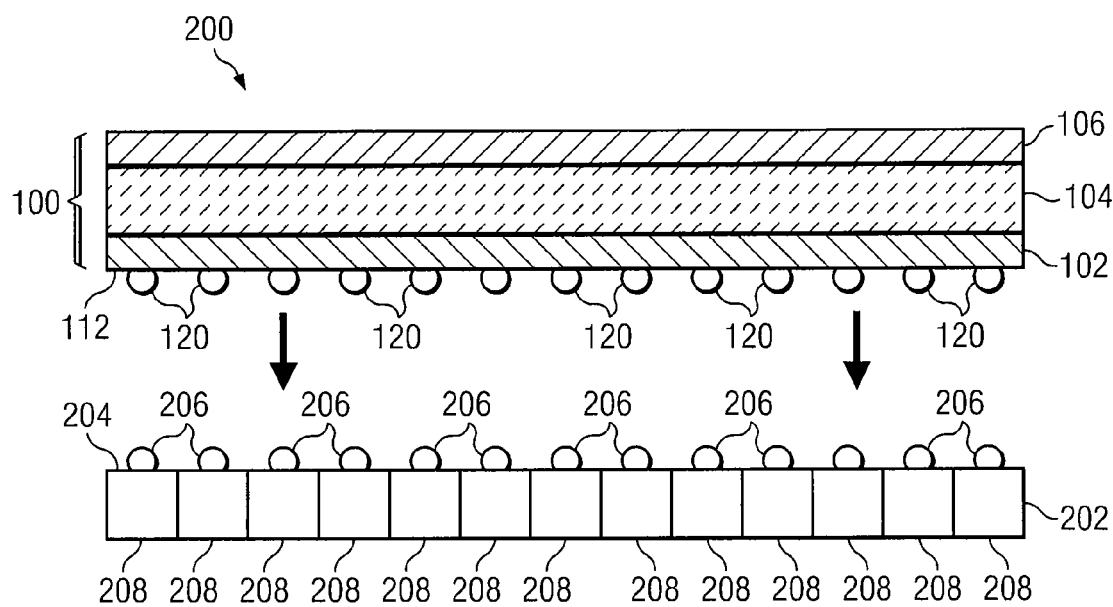
FIGS. 2A-2B illustrate cross-sectional views of a device formed by hybridizing a first substrate of a composite semiconductor structure to a thermally matched second substrate, according to certain embodiments of the present invention.
Figure 2B:
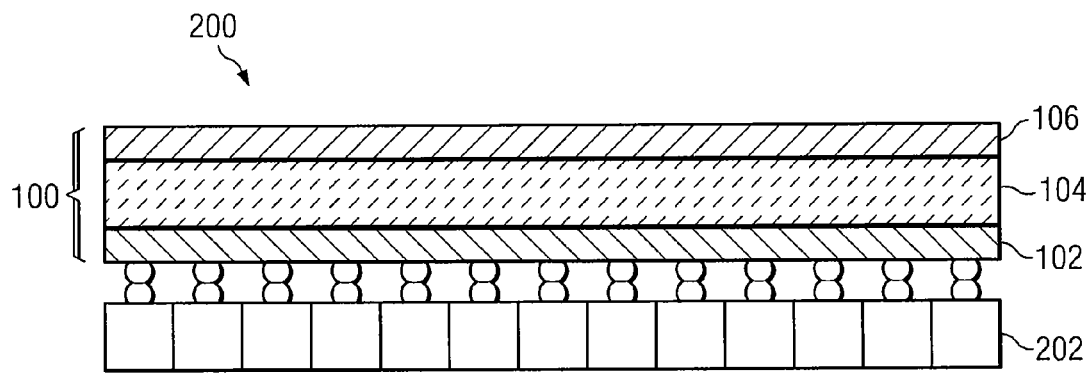

FIGS. 2A-2B illustrate cross-sectional views of a device 200 formed by hybridizing first substrate 102 of a composite semiconductor structure 100 to a thermally matched second substrate 202, according to certain embodiments of the present invention. First substrate 102 may be part of a composite semiconductor structure 100 (formed as described above with regard to FIG. 1) having a rate of thermal expansion substantially equal to the rate of thermal expansion of second substrate 202. In certain embodiments, composite semiconductor structure 100 may have a non-uniform rate of thermal expansion. For example, the rate of thermal expansion of first substrate 102 of composite semiconductor structure 100 may be greater at surface 110 (the point at which it is boned to thermal matching substrate 104 having a CTE greater than first substrate 102) than at surface 112 (the surface to be hybridized to first surface 104 of second substrate 202, as described below). In embodiments in which composite semiconductor structure 100 has a non-uniform rate of thermal expansion, first substrate 102 may be thermally matched to second substrate 202 such that the rate of thermal expansion at second surface 112 of first substrate 102 (i.e., the rate at which second surface 112 expands/contracts in response to temperature changes) is substantially the same rate as the rate of thermal expansion of first surface 204 of second substrate 202 (i.e., the rate at which first surface 204 expands/contracts in response to temperature changes).

In certain embodiments, first substrate 102 of composite semiconductor structure 100 is hybridized to second substrate 202 such that a plurality of interconnects 120 of second surface 112 of first substrate 102 are bonded to (i.e., in electrical contact with) a plurality of corresponding interconnects 206 of first surface 204 of second substrate 202.

Interconnects 120 of first substrate 102 may be deposited on second surface 112 of first substrate 102 and may comprise bumps constructed of indium, tin, lead, bismuth alloy, or any other suitable conductive material. In certain embodiments, interconnects 120 of first substrate 102 may be deposited on second surface 112 of first substrate 102 at a temperature greater that ambient temperature (i.e., an elevated temperature). Because composite semiconductor structure 100 is formed using atomic bonds 108 that are not temperature sensitive (or relatively insensitive to changes in temperature, as described above with regard to FIG. 1), the depositing of interconnects 120 on second surface 112 of first substrate 102 at an elevated temperature may not compromise the integrity of the bonds of composite semiconductor structure 100. As a result, composite semiconductor structure may be formed prior to the depositing of interconnects 120 on second surface 112 of first substrate 102 without compromising the thermal matching of first substrate 102 with second substrate 202.

Interconnects 206 of second substrate 202 may be deposited on first surface 204 of second substrate 202 and may comprise bumps constructed of indium, tin, lead, bismuth alloy, or any other suitable conductive material.

Hybridization of first substrate 102 of a composite semiconductor structure 100 to thermally matched second substrate 202 may be performed at ambient temperature (e.g., room temperature) by applying a force to composite semiconductor structure 100 and/or second substrate 202 such that interconnects 120 of second surface 112 of first substrate 102 are pressed together with (i.e., bonded to) corresponding interconnects 206 of first surface 204 of second substrate 202, creating an electrical contact. As the size of device 200 increases, however, the number of interconnects 120 and 206 may also increase. As a result, more force may be required to press together interconnects 120 of first substrate 102 with corresponding interconnects 206 of second substrate 202, which may result in damage to composite semiconductor structure 100 and/or second substrate 202.

Alternatively, hybridization of first substrate 102 of a composite semiconductor structure 100 to thermally matched second substrate 202 may be performed at a temperature greater than ambient temperature (i.e., at an elevated temperature), which may reduce the force required to press together (i.e., bond) interconnects 120 of first substrate 102 with corresponding interconnects 206 of second substrate 202 to create an electrical contact, thereby reducing the possibility of damaging composite semiconductor structure 100 and/or second substrate 202. For example, interconnects 120 and 206 may each comprise indium bumps (as described above), and hybridization may be performed at a temperature at or near the melting point of indium (approximately 156 degrees Celsius). Because hybridization is performed at a temperature at or near the melting point of indium, the force required to press together (i.e., bond) interconnects 120 of first substrate 102 with corresponding interconnects 206 of second substrate 202 is likely less than the force required to press together the corresponding interconnects at ambient temperature.

Because composite semiconductor structure 100 is formed using atomic bonds 108 that are not temperature sensitive (or relatively insensitive to changes in temperature, as described above with regard to FIG. 1), elevated temperature hybridization may not compromise the integrity of the bonds of composite semiconductor structure 100. As a result, first substrate 102 and second substrate 202 may remain thermally matched as the temperature is increased during elevated temperature hybridization (e.g., to a temperature at or near the melting point of indium, which is approximately 156 degrees Celsius) such that alignment between interconnects 120 of first substrate 102 and corresponding interconnects 206 of second substrate 202 is maintained (as second surface 112 of first substrate 102 and first surface 204 of second substrate 202 expand at substantially the same rate in response to changes in temperature). Thus, the formation of composite semiconductor structure 100 using atomic bonds 108 may allow for the formation of a device 200 comprising a first substrate 102 hybridized at elevated temperature to second substrate 202 while reducing or eliminating misalignment between interconnects 120 of first substrate 102 and corresponding interconnects 206 of second substrate 202.

Additionally, because first substrate 102 is thermally matched to second substrate 202 (i.e., first substrate 102 expands and contracts at substantially the same rate as second substrate 202 is response to changes in temperature), electrical contact between corresponding interconnects of first substrate 102 and second substrate 202 may be maintained as device 200 is subjected to variations in temperature. If first substrate 102 and second substrate 202 were not thermally matched (i.e., first substrate 102 and second substrate 202 expanded and contracted at different rates in response to temperature changes), the electrical connection between certain corresponding interconnects of device 200 may be lost (i.e., the corresponding interconnects may be pulled apart), particularly corresponding interconnects located near the edges of device 200 where the linear movement resulting from the expansion/contraction of first substrate 102 and second substrate 202 is greatest.

As a particular example, device 200 may be a SCA for generating an image of an object, the SCA having a silicon die comprising a ROIC device (i.e., first substrate 102 of composite semiconductor structure 100) hybridized to a silicon die comprising a detector array (i.e., second substrate 202). The detector array (i.e., second substrate 202) may comprise a plurality of detectors 208 each operable to collect image data for an object, and each detector 208 may have an associated interconnect 206 (e.g., an indium bump). The detector array (i.e., second substrate 202) may be hybridized to the ROIC device (i.e., first substrate 102 of composite semiconductor structure 100) such that each interconnect 206 of the detector array is bonded to (i.e., in electrical contact with) a corresponding interconnect 120 of the ROIC device (i.e., first substrate 102 of composite semiconductor structure 100) such that the image data collected by each of the detectors 208 of the detector array may be transferred to the ROIC device. The ROIC device may facilitate the generation of an image of the object based on the received image data from each of the detectors 208 of the detector array.

Because the ROIC device (i.e., first substrate 102) is thermally matched to detector array (i.e., second substrate 202), alignment between corresponding interconnects of the ROIC device and the detector array may be maintained during elevated temperature hybridization. Maintaining thermal matching of the ROIC device to the detector array during elevated temperature hybridization may be particularly important for forming large SCAs as the potential for misalignment between corresponding interconnects of the ROIC device and the detector array increases as the size of the ROIC device and the size of the detector array increase (particularly corresponding interconnect located near the edges of the SCA).

Additionally, because the ROIC device (i.e., first substrate 102) is thermally matched to detector array (i.e., second substrate 202), electrical contact between corresponding interconnects of the ROIC device and the detector array may be maintained as the SCA is subjected to variations in temperature, which may be particularly important for SCAs having very low operating temperatures. If the ROIC device and the detector array were not thermally matched, the electrical connection between certain corresponding interconnects of the SCA may be lost (i.e., the corresponding interconnects may be pulled apart), particularly corresponding interconnects located near the edges of the SCA where the linear movement due to the expansion/contraction of the ROIC device and the detector array is greatest. As a result, the ROIC may not receive image data from certain detectors 208 of the detector array, which may result in poor image quality.

Although the above described hybridization process is depicted and primarily described as being performed at the die level to generate a single device 200, the present invention additionally contemplates the hybridization process being performed at the wafer level to generate a plurality of devices 200, the plurality of devices 200 being subsequently diced into individual devices 200. For example, rather than dicing composite semiconductor structure 100 into a plurality of dies each comprising a single ROIC device and hybridizing each die comprising a single ROIC device to a die comprising a single detector array to generate a single SCA (as described above), the present invention contemplates composite semiconductor structure 100 (e.g., including a silicon wafer comprising a plurality of ROIC devices) being hybridized to a silicon wafer comprising a plurality of detector arrays to generate a plurality of SCAs that may be subsequently diced into individual SCAs.

Figure 3:
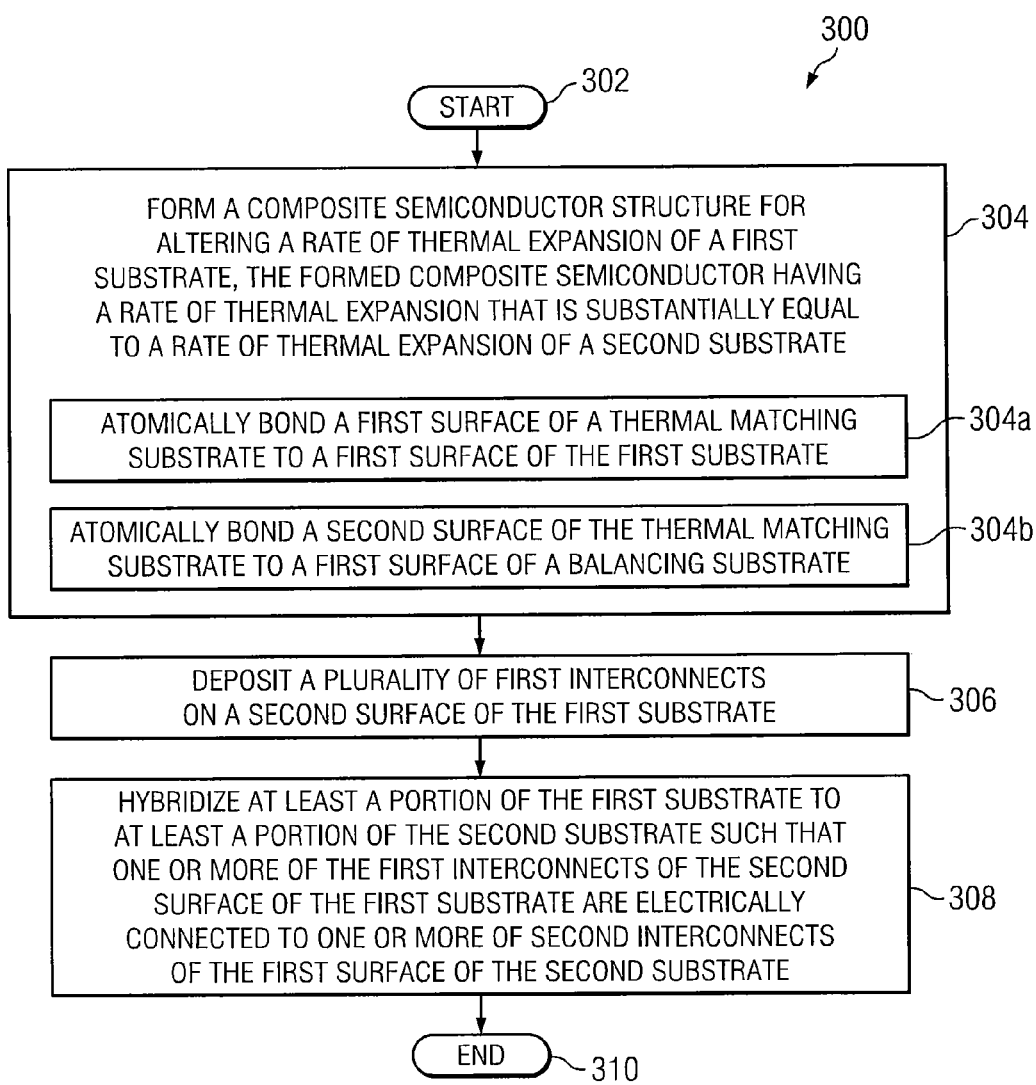
FIG. 3 illustrates an example method for forming a device comprising a first substrate of a composite semiconductor structure hybridized to a thermally matched second substrate, according to certain embodiments of the present invention.

FIG. 3 illustrates an example method 300 for forming a device 200 comprising first substrate 102 of a composite semiconductor structure 100 hybridized to thermally matched second substrate 202, according to certain embodiments of the present invention. The method begins at step 302. At step 304, composite semiconductor structure 100 is formed. Composite semiconductor structure 100 is adapted to alter a rate of thermal expansion of first substrate 102 such that the formed composite semiconductor structure 100 has a rate of thermal expansion that is substantially equal to a rate of thermal expansion of a second substrate 202 to which first substrate 102 is to be hybridized. For example, first substrate 102 may be a silicon wafer comprising a plurality of ROIC devices and second substrate 202 may be a silicon wafer comprising a plurality of detector arrays (such that each ROIC device may be hybridized to a detector array to generate an SCA, as described below).

More particularly, at step 304a, first surface 114 of thermal matching substrate 104 is atomically bonded to first surface 110 of first substrate 102. At step 304b, second surface 116 of thermal matching substrate 104 is atomically bonded to first surface 118 of balancing substrate 106. Thermal matching substrate 104 may be a material selected such that, when atomically bonded to first substrate 102 and balancing substrate 106, causes first substrate 102 to expand and contract at substantially the same rate as second substrate 202 in response to changes in temperature (as described above with regard to FIG. 1). Balancing substrate 106 may be a material selected such that, when atomically bonded to thermal matching substrate 104, provides substantially the same resistance to expansion/contraction in response to changes in temperature as first substrate 102. Thus, balancing substrate 106 may substantially prevent warping of composite semiconductor structure 100 in response to changes in temperature.

At step 306, a plurality of first interconnects 120 are deposited on second surface 112 of first substrate 102 of composite semiconductor structure 100. For example, interconnects 120 may be indium bumps deposited on second surface 112 of first substrate 102. In certain embodiments, interconnects 120 of first substrate 102 may be deposited on second surface 112 of first substrate 102 at a temperature greater that ambient temperature (i.e., an elevated temperature). Because composite semiconductor structure 100 is formed using atomic bonds 108 that are not temperature sensitive (or relatively insensitive to changes in temperature, as described above with regard to FIG. 1), the depositing of interconnects 120 on second surface 112 of first substrate 102 at an elevated temperature may not compromise the integrity of the bonds of composite semiconductor structure 100.

At step 308, at least a portion of first substrate 102 of composite semiconductor structure 100 is hybridized to at least a portion of second substrate 202 such that one or more interconnects 120 of second surface 112 of first substrate 102 are bonded (i.e., electrically connected) to one or more corresponding interconnects 206 (e.g., indium bumps) of first surface 204 of second substrate 202. In certain embodiments, the hybridization may be performed at an elevated temperature (e.g., a temperature at or near the melting point of indium, which is approximately 156 degrees Celsius) such that less force is required to press interconnects 120 of first substrate 102 together with interconnects 206 of second substrate 202. Because composite semiconductor structure 100 is formed using atomic bonds 108 that are not temperature sensitive (or relatively insensitive to changes in temperature, as described above with regard to FIG. 1), elevated temperature hybridization may not compromise the integrity of the bonds of composite semiconductor structure 100. As a result, first substrate 102 and second substrate 202 may remain thermally matched as the temperature is increased (e.g., to a temperature at or near the melting point of indium, which is approximately 156 degrees Celsius) during elevated temperature hybridization such that alignment between interconnects 120 of first substrate 102 and corresponding interconnects 206 of second substrate 202 is maintained (as first substrate 102 and second substrate 202 expand at substantially the same rate).

As a particular example, first substrate 102 may be a silicon wafer comprising a plurality of ROIC devices and second substrate 202 may be a silicon wafer comprising a plurality of detector arrays. In certain embodiments, the hybridization is performed at the die level such that a die comprising a single ROIC device is hybridized to die comprising a single detector array to generate a SCA (i.e., device 200). In other words, the hybridization is performed subsequent to composite semiconductor structure 100 being diced into a plurality of dies (each comprising a single ROIC device) and second substrate 202 being diced into a plurality of dies (each comprising a single detector array). Furthermore, the detector array may comprise a plurality of detectors 208 each having an associated interconnect 206, and the detector array may be hybridized to the ROIC device such that each interconnect of the detector array is in electrical contact with a corresponding interconnect of the ROIC device. As a result, image data collected by each detector of the detector array may be transferred to the ROIC device, and the ROIC device may facilitate the generation of an image.

Because the ROIC device (i.e., first substrate 102) is thermally matched to detector array (i.e., second substrate 202) by virtue of being part of composite semiconductor structure 100, alignment between corresponding interconnects of the ROIC device and the detector array may be maintained during elevated temperature hybridization. Additionally, because the ROIC device (i.e., first substrate 102) is thermally matched to the detector array (i.e., second substrate 202) by virtue of being part of composite semiconductor structure 100, electrical contact between corresponding interconnects 120 and 206 of the SCA may be maintained over a range of operating temperatures of the SCA.

Although the particular steps of method 300 have been illustrated and primarily described as being performed in a particular order, the present invention contemplates that the steps take place in any suitable order, according to particular needs. For example, in certain embodiments, second surface 116 of the thermal matching substrate 104 may be atomically bonded to first surface 118 of balancing substrate 106 prior to first surface 114 of thermal matching substrate 104 being atomically bonded to first surface 110 of first substrate 102.

Although the present invention has been described with several embodiments, diverse changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. A method, comprising:
    forming a composite semiconductor structure adapted to alter a rate of thermal expansion of a first substrate, the composite semiconductor structure formed by:
        atomically bonding a first surface of a thermal matching substrate to a first surface of the first substrate, the thermal matching substrate adapted to alter the rate of thermal expansion of the first substrate;
        atomically bonding a second surface of the thermal matching substrate to a first surface of a balancing substrate, the balancing substrate adapted to substantially prevent warping of the composite semiconductor structure.

2. The method of claim 1, wherein the composite semiconductor structure has a rate of thermal expansion that is substantially equal to a rate of thermal expansion of a second substrate, the rate of thermal expansion of the second substrate being different than the rate of thermal expansion of the first substrate.

3. The method of claim 2, wherein:
the first substrate is a wafer comprising a plurality of readout integrate circuits (ROIC) devices; and
the second substrate is a wafer comprising a plurality of detector arrays, one or more of the plurality of detector arrays of the second substrate having a corresponding ROIC device of the first substrate.

4. The method of claim 2, wherein:
a second surface of the first substrate comprises a plurality of first interconnects;
a first surface of the second substrate comprises a plurality of second interconnects.

5. The method of claim 4, further comprising hybridizing at least a portion of the first substrate to at least a portion of the second substrate such that one or more of the first interconnects of the second surface of the first substrate are electrically connected to a corresponding one or more of the second interconnects of the first surface of the second substrate.

6. The method of claim 5, wherein the hybridization is performed at a temperature greater than ambient temperature.

7. The method of claim 5, wherein:
the first substrate is a wafer comprising a plurality of ROIC devices;
the second substrate is a wafer comprising a plurality of detector arrays, one or more of the plurality of detector arrays of the second substrate having a corresponding ROIC device of the first substrate; and
the hybridization is performed at the wafer level.

8. The method of claim 5, wherein:
the first substrate is a wafer comprising a plurality of ROIC devices;
the second substrate is a wafer comprising a plurality of detector arrays, one or more of the plurality of detector arrays of the second substrate having a corresponding ROIC device of the first substrate;
the method further comprises:
dicing the first substrate into a plurality of dies each comprising a one of the plurality of ROIC devices; and
dicing the second substrate into a plurality of dies each comprising one of the plurality of detector arrays; and
the hybridization is performed at the die level.

9. The method of claim 1, wherein:
a coefficient of thermal expansion (CTE) of the thermal matching substrate is greater than a CTE of the first substrate; and
a CTE of the balancing substrate is substantially equal to the CTE of the first substrate.

10. A system, comprising:
a first substrate;
a thermal matching substrate; and
a balancing substrate;
wherein:
a first surface of the thermal matching substrate is atomically bonded to a first surface of the first substrate and a second surface of the thermal matching substrate is atomically bonded to a first surface of the balancing substrate to form a composite semiconductor structure;
the thermal matching substrate is adapted to alter the rate of thermal expansion of the first substrate; and
the balancing substrate is adapted to substantially prevent warping of the composite semiconductor structure.

11. The system of claim 10, further comprising a second substrate, wherein the composite semiconductor structure has a rate of thermal expansion that is substantially equal to a rate of thermal expansion of the second substrate, the rate of thermal expansion of the second substrate being different than the rate of thermal expansion of the first substrate.

12. The system of claim 11, wherein:
the first substrate is a wafer comprising a plurality of readout integrate circuits (ROIC) devices; and
the second substrate is a wafer comprising a plurality of detector arrays, one or more of the plurality of detector arrays of the second substrate having a corresponding ROIC device of the first substrate.

13. The system of claim 11, wherein:
a second surface of the first substrate comprises a plurality of first interconnects;
a first surface of the second substrate comprises a plurality of second interconnects.

14. The system of claim 13, wherein at least a portion of the first substrate is hybridized to at least a portion of the second substrate such that one or more of the first interconnects of the second surface of the first substrate are electrically connected to a corresponding one or more of the second interconnects of the first surface of the second substrate.

15. The system of claim 14, wherein the hybridization is performed at a temperature greater than ambient temperature.

16. The system of claim 14, wherein:
the first substrate is a wafer comprising a plurality of ROIC devices;
the second substrate is a wafer comprising a plurality of detector arrays, one or more of the plurality of detector arrays of the second substrate having a corresponding ROIC device of the first substrate; and
the hybridization is performed at the wafer level.

17. The system of claim 14, wherein:
the first substrate is a wafer comprising a plurality of ROIC devices;
the second substrate is a wafer comprising a plurality of detector arrays, one or more of the plurality of detector arrays of the second substrate having a corresponding ROIC device of the first substrate; and
the hybridization is performed at the die level, the first substrate having been diced into a plurality of dies each comprising a one of the plurality of ROIC devices and the second substrate having been diced into a plurality of dies each comprising one of the plurality of detector arrays.

18. The system of claim 10, wherein:
a coefficient of thermal expansion (CTE) of the thermal matching substrate is greater than a CTE of the first substrate; and
a CTE of the balancing substrate is substantially equal to the CTE of the first substrate.

19. A method, comprising:
forming a composite semiconductor structure for altering a rate of thermal expansion of a wafer comprising a plurality of readout integrate circuits (ROIC) devices to be substantially equal to a rate of thermal of a wafer comprising a plurality of detector arrays, the composite semiconductor structure formed by:
atomically bonding a first surface of a thermal matching substrate to a first surface of the wafer comprising the plurality of ROIC devices, the thermal matching substrate adapted to alter the rate of thermal expansion of the wafer comprising the plurality of readout integrate circuits (ROIC) devices;

atomically bonding a second surface of the thermal matching substrate to a first surface of a balancing substrate, the balancing substrate adapted to substantially prevent warping of the composite semiconductor structure;

hybridizing at least a portion of the wafer comprising the plurality ROIC devices to at least a portion of the wafer comprising a plurality of detector arrays such that one or more first interconnects of a second surface of the wafer comprising the plurality of ROIC are electrically connected to a corresponding one or more second interconnects of a first surface of the wafer comprising a plurality of detector arrays.

20. The method of claim 19, wherein:

the method further comprises:
dicing the wafer comprising the plurality ROIC devices into a plurality of dies each comprising one of the plurality of ROIC devices; and
dicing the wafer comprising a plurality of detector arrays into a plurality of dies each comprising one of the plurality of detector arrays; and the hybridization is performed at the die level.

* * * * *